US008503888B2

(12) United States Patent
Takemoto et al.

(10) Patent No.: US 8,503,888 B2
(45) Date of Patent: Aug. 6, 2013

(54) OPTICAL COMMUNICATION MODULE AND OPTICAL COMMUNICATION DEVICE

(75) Inventors: Takashi Takemoto, Fuchu (JP); Hiroki Yamashita, Hachioji (JP); Shinji Tsuji, Hidaka (JP)

(73) Assignee: Hitachi, Ltd., Tokyo (JP)

( * ) Notice: Subject to any disclaimer, the term of this patent is extended or adjusted under 35 U.S.C. 154(b) by 184 days.

(21) Appl. No.: 13/085,470

(22) Filed: Apr. 12, 2011

(65) Prior Publication Data
US 2011/0249980 A1 Oct. 13, 2011

(30) Foreign Application Priority Data

Apr. 13, 2010 (JP) .................................. 2010-092130

(51) Int. Cl.
*H04B 10/04* (2006.01)
*H04B 10/12* (2006.01)
(52) U.S. Cl.
USPC .......................................... 398/201; 398/182
(58) Field of Classification Search
None
See application file for complete search history.

(56) References Cited

U.S. PATENT DOCUMENTS

| 5,646,763 | A  | * | 7/1997  | Misaizu et al. ............... 398/197 |
| 6,097,746 | A  | * | 8/2000  | Noda et al. .................. 372/38.09 |
| 7,680,367 | B2 |   | 3/2010  | Matsuoka et al. |
| 2004/0067061 | A1 | * | 4/2004  | Jiang et al. ................. 398/135 |
| 2004/0208207 | A1 | * | 10/2004 | Kasper et al. .................. 372/26 |
| 2005/0213622 | A1 | * | 9/2005  | Diaz ......................... 372/38.02 |
| 2005/0279949 | A1 | * | 12/2005 | Oldham et al. ............ 250/458.1 |
| 2008/0247713 | A1 |   | 10/2008 | Tamura et al. |
| 2010/0215325 | A1 |   | 8/2010  | Tamura et al. |

FOREIGN PATENT DOCUMENTS

| JP | 10-284783 A | 10/1998 |
| JP | 2000-278215 A | 10/2000 |
| JP | 2002-111120 A | 4/2002 |
| JP | 2002-221642 A | 8/2002 |
| JP | 2003-298181 A | 10/2003 |
| JP | 2004-163722 A | 6/2004 |
| JP | 2006-269981 A | 10/2006 |
| JP | 2008-257094 A | 10/2008 |
| JP | 2009-253654 A | 10/2009 |
| WO | WO 2006/054569 A1 | 5/2006 |

OTHER PUBLICATIONS

Office Action in Japanese Patent Application 2010-092130 (Apr. 3, 2012).

* cited by examiner

*Primary Examiner* — Kenneth N Vanderpuye
*Assistant Examiner* — Casey Kretzer
(74) *Attorney, Agent, or Firm* — Miles & Stockbridge, P.C.

(57) ABSTRACT

An optical communication module and an optical communication device including the same are provided. For example, a first semiconductor chip on which a laser diode is formed and a second semiconductor chip on which a laser diode driver circuit, etc. for subjecting the laser diode to drive by current are formed are mounted on a package printed circuit board to be close to each other. Temperature detecting means is further formed on the second semiconductor chip (laser diode driver circuit, etc.). The temperature detecting means detects a temperature variation ΔT of the first semiconductor chip (laser diode) transmitted via a wiring in the package printed circuit board and controls the magnitude of the driving current of the laser diode driver circuit based on a detection result.

13 Claims, 13 Drawing Sheets

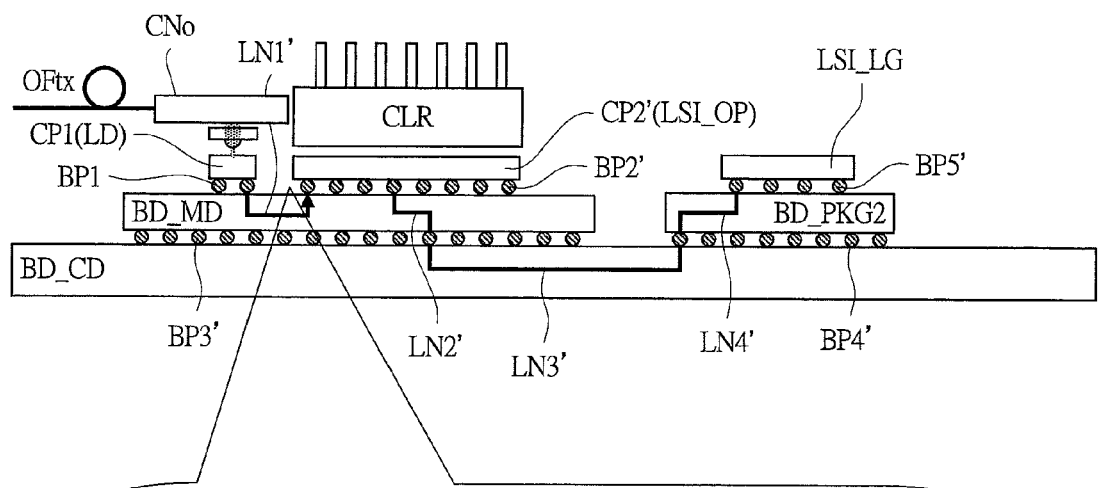
FIG. 10A
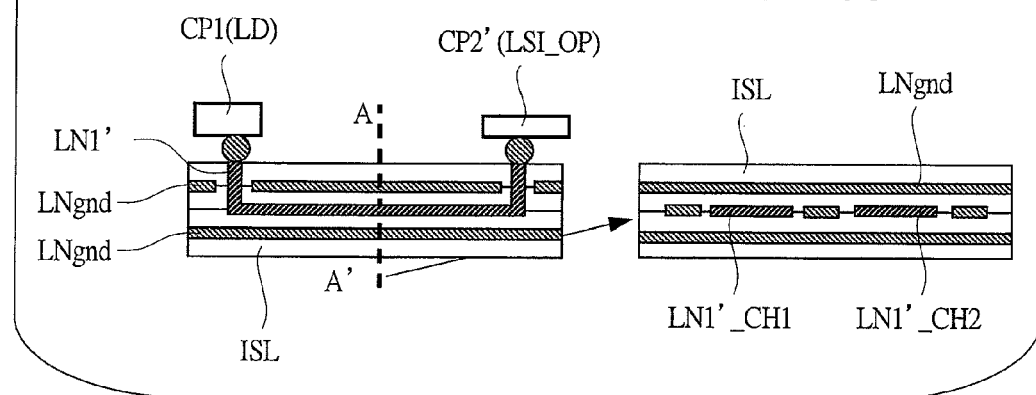
FIG. 10B
FIG. 10C

OPTICAL COMMUNICATION MODULE AND OPTICAL COMMUNICATION DEVICE

CROSS-REFERENCE TO RELATED APPLICATION

The present application claims priority from Japanese Patent Application No. 2010-092130 filed on Apr. 13, 2010, the content of which is hereby incorporated by reference into this application.

TECHNICAL FIELD OF THE INVENTION

The present invention relates to an optical communication module and an optical communication device including the same and particularly relates to a techniques effectively applied to an optical communication device such as a router or a server and an optical communication module which is one of parts of the optical communication device and carries out optical communication by using a laser diode.

BACKGROUND OF THE INVENTION

For example, in Japanese Patent Application Laid-Open Publication No. 2003-298181, an optical transmission circuit which suppresses variations in the extinction ratio of output light of a laser caused by variations in laser characteristics is described. Specifically, a composition, etc. for detecting optical signals from a laser diode by a photodiode and changing the bias current of the laser diode in accordance with a DC component of an output of the photodiode is disclosed. By virtue of this, the temperature variations occurring in the threshold current of the laser diode can be compensated for.

In recent years, along with improvements in the communication speed, the communication speed undergoes transition from 10 Gbps to 25 Gbps, 40 Gbps, etc. Along with such improvements in the communication speed, application of optical communication devices supporting optical fiber cables as, for example, router devices or server devices is advancing. The optical communication devices usually presuppose the transmission in a long distance on the order of, for, kilometers between devices, and it is important to ensure reliability with this transmission distance. For example, in a laser diode serving as a transmission element of optical signals, variations in the light output intensity caused in relation to temperature (in other words, reduction in reliability) are problems. Therefore, for example, like the one Japanese Patent Application Laid-Open Publication No. 2003-298181 (Patent Document 1), a method in which, with respect to a laser diode, a monitoring photodiode which detects the light output intensity the laser diode is disposed in the vicinity of the laser diode so as to suppress the variations in the light output intensity is used.

FIG. 15 is a circuit block diagram illustrating an example of a composition of an optical communication module studied as a premise of the present invention. The optical communication module illustrated in FIG. 15 includes a laser diode block LDBK including a laser diode LD and a monitoring photodiode PDm, a laser diode driver circuit LDD1 which drives LD, a current/voltage converter circuit IVC which converts a current from PDm to a voltage and averages it, and an error amplifier circuit EA. LDBK is realized, for example, by one package.

LDD1 includes a variable current source CSV which causes a bias current to flow and a driver circuit DV which controls the current of LD by adding or subtracting an AC current to or from the bias current of CSV in accordance with the logic of an input signal Vin. LD emits light in accordance with the magnitude of the current, and the intensity of the light emission is detected as a current flowing to PDm. IVC averages the current of PDm as a voltage, and EA controls the current value of CSV so that the averaged voltage (i.e., it indicates average light emission intensity) becomes constant. When the method like that of FIG. 15 is used, the above-described variations in the light output intensity caused in accordance with temperature can be suppressed. To further enhance reliability, for example, it is conceivable to add a Peltier element for maintaining a constant temperature and a thermistor or the like for controlling the Peltier element to the inside of the package of the laser diode block LDBK.

On the other hand, the above-described optical communication devices include many kinds of devices having comparatively large sizes (for example, on the orders of several tens of centimeters and meters), and communications using electric signals are usually carried out in the devices. Therefore, in the optical communication devices, for example, optical signals input from outside are converted to electric signals, predetermined processes are carried out while carrying out short-distance communications (for example, on the order of meters) by the electric signals in the devices, and the electric signals are converted to optical signals again and output to the outside. The short-distance communication is carried out by using, for example, copper cables; however, as the communication speed is increased, the quality of transmission waveforms is extremely lowered in the case of using the copper cables. Therefore, application of optical communications to the short-distance communications in such devices is required.

Therefore, it is conceivable to install an optical communication module including a laser diode block LDBK such as that described above at the part of each output interface in such a device. However, since the number of parts is large in the laser diode block LDBK as described above, the cost is increased, and ensuring a mounting area of the parts is not easy. Thus, when viewed from the user side, upon change from the copper cables to optical fiber cables, realizing an optical communication device by replacing only the part of input/output interfaces with respect to an existing device instead of newly introducing a whole device is desirable in terms of cost, etc.

In this case, the laser diode block LDBK, etc. have to be mounted within the range of the limited mounting area where the part of input/output interfaces is present in the existing device; therefore, the number of parts is desired to be reduced as much as possible. Even in the case in which LDBK is composed of LD and PDm, a mechanism or the like which outputs the light emitted from LD to the two directions for communication and for monitoring is required; therefore, the size of LDBK becomes comparatively large.

SUMMARY OF THE INVENTION

The present invention has been made in view of the foregoing points, and it is a preferred aim of the present invention to realize downsizing of an optical communication module and an optical communication device including the optical communication module. The above-described and other objects and novel characteristics of the present invention will be apparent from the descriptions and attached drawings of the present specification.

The typical ones of the inventions disclosed in the present application will be briefly described as follows.

An optical communication module according to the present embodiment includes: a first semiconductor chip to which a laser diode outputting an optical signal is formed; a first wiring; and a second semiconductor chip to which a driver circuit driving the laser diode by a first current is formed, the semiconductor chip being connected to the first semiconductor chip via the first wiring. In addition, a driver control circuit which detects a temperature variation of the first semiconductor chip transferred in heat via the first wiring and adjusts magnitude of the first current based on a detection result is further formed on the second semiconductor chip. When such a configuration example is used, it is not required to provide the monitoring photodiode or the like being close to the laser diode and detecting optical output intensity, and downsizing etc. of the optical communication module and the optical communication device including the optical communication module can be realized.

The effects obtained by a typical embodiment of the invention disclosed in the present application can be simply explained as realization of downsizing of an optical communication module and an optical communication device including the optical communication module.

BRIEF DESCRIPTIONS OF THE DRAWINGS

FIG. 10A is a cross-sectional view illustrating an example of a schematic mounting structure of the optical communication device of FIG. 9;

FIG. 10B is a cross-sectional view illustrating a structure example in which part of a module printed circuit board of FIG. 10A is enlarged;

FIG. 10C is a cross-sectional view illustrating a structure example cut along the line A-A' of FIG. 10B;

DESCRIPTIONS OF THE PREFERRED EMBODIMENTS

Figure 1A:
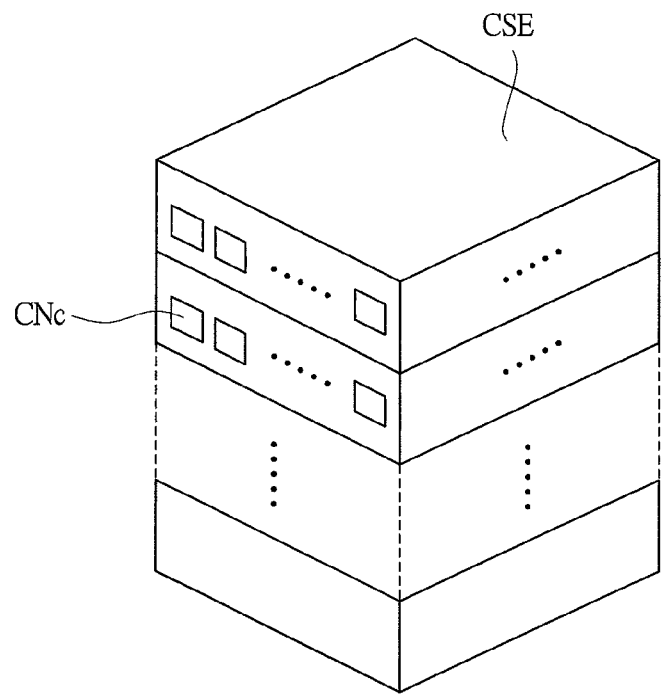
FIG. 1A illustrates an optical communication device according to a first embodiment of the present invention, being a perspective view illustrating an example of an outer shape of the optical communication device.

In the embodiments described below, the invention will be described in a plurality of sections or embodiments when required as a matter of convenience. Also, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle.

In addition, although circuit elements configuring each function block of the embodiments are not limited, the circuit elements are formed on a semiconductor substrate such as single crystal silicon by integrated circuit technologies of CMOS (complimentary MOS transistor). Note that, in the embodiments, while MOSFET (metal oxide semiconductor field effect transistor) is used as one example of MISFET (metal insulator semiconductor field effect transistor) (abbreviated as MOS transistor), using non-oxide film as a gate insulating film is not eliminated. While a connection of substrate potential of the MOS transistor is not particularly illustrated in the drawings, a method of the connection is not particularly limited in a range in which the MOS transistor can be normally operated.

Hereinafter, embodiments of the present invention will be described in detail with reference to the accompanying drawings. Note that components having the same function are denoted by the same reference symbols throughout the drawings for describing the embodiment, and the repetitive description thereof will be omitted.

First Embodiment

Figure 1B:
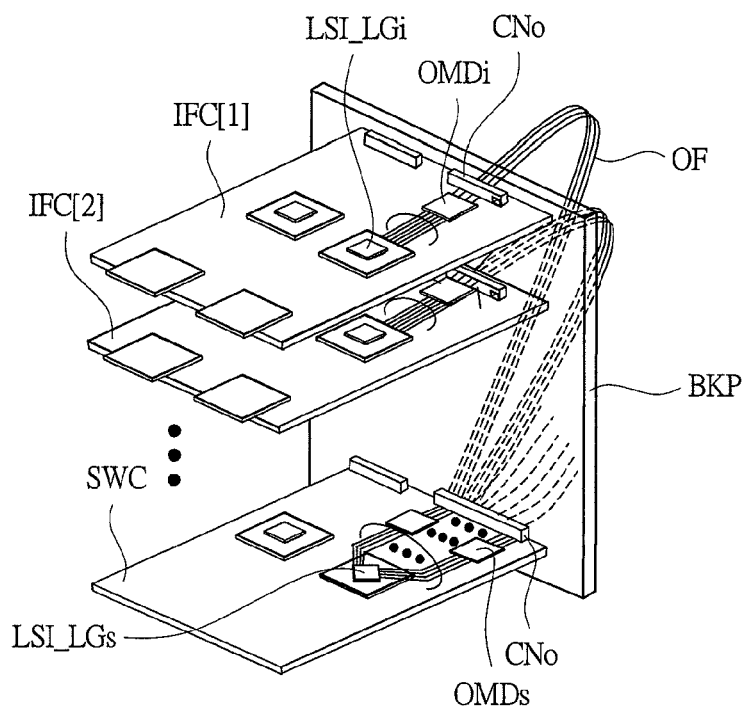
FIG. 1B illustrates the optical communication device according to the first embodiment of the present invention, being a perspective view illustrating an example of an internal structure of FIG. 1A.

FIGS. 1A and 1B illustrate an optical communication device according to a first embodiment of the present invention. FIG. 1A is a perspective view illustrating an example of an outer shape of the optical communication device, and FIG. 1B is a perspective view illustrating an example of an internal structure of FIG. 1A. The optical communication device illustrated in FIG. 1A is a router device or the like and composed of a chassis CSE having, for example, a width of several tens of centimeters, a depth of several tens of centimeters, and a height of 1 to 2 meters. A lot of communication connectors CNc are provided on a surface of CSE, and each CNc is, for example, an Ethernet (registered trade name) cable terminal, an optical fiber cable terminal, or the like.

For example as illustrated in FIG. 1B, a plurality of interface cards IFC[1], IFC[2], . . . , a switch card SWC, etc. are provided in CSE. Each of the cards is connected to a card connector provided on a part called, for example, backplane BKP. Each card connector includes a connector for supplying electric power from BKP to the card and an optical connector (optical fiber connector) CNo for carrying out communication between the cards via optical communication lines (typically, optical fiber cables) OF. Herein, each of the interface cards IFC is connected to the switch card SWC via CNo and the optical communication line OF so as to enable communication between the communication connectors CNc belonging to respective IFC via SWC.

A logical device LSI_LGi which carries out a predetermined protocol processing required in an upper layer of communication, and an optical communication module OMDi which converts electric signals serving as input/output of LSI_LGi to optical signals and carries out input/output to/from the optical communication line OF via the optical connector CNo are mounted on each IFC. Similarly, a logical device LSI_LGs which carries out a predetermined protocol processing and an optical communication module OMDs which converts electric signals serving as input/output of LSI_LGs to optical signals and carries out input/output to/from OF via CNo are mounted also on SWC.

In such an optical communication device, a length of each optical communication line OF sometimes reaches, for example, several meters. If a copper cable or the like is used instead of OF in that case, the communication of, for example, communication at several-ten Gbps level may not be supported. Therefore, using the optical communication device of the present embodiment is advantageous.

Figure 2:
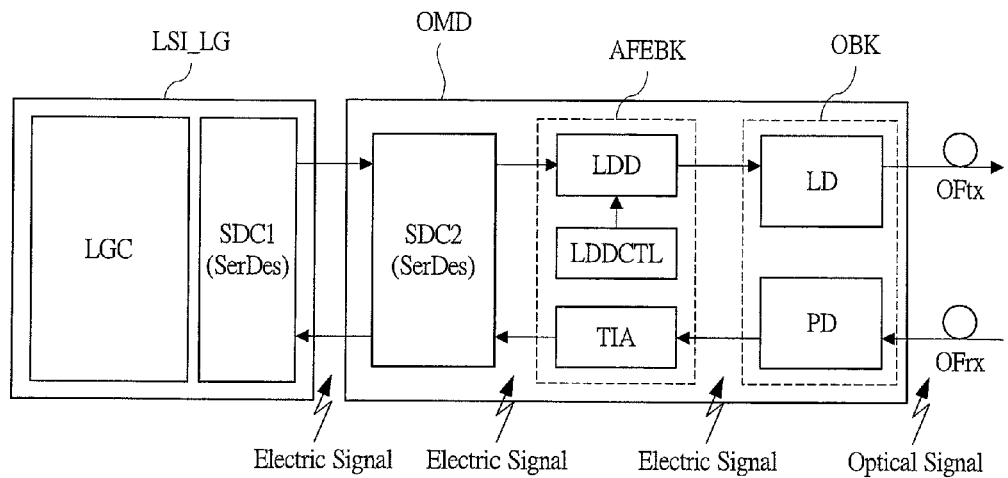
FIG. 2 is a block diagram illustrating a configuration example of a logical device and an optical communication module of the optical communication device of FIGS. 1A and 1B.

FIG. 2 is a block diagram illustrating a configuration example of a logical device LSI_LG and an optical communication module OMD of the optical communication device of FIGS. 1A and 1B. In FIG. 2, the logical device LSI_LG includes a logical operation processor circuit LGC and a transmission speed converter circuit SDC1. The optical communication module OMD includes a transmission speed converter circuit SDC2, an analog front end block AFEBK, and an optical element block OBK. Herein, for example, LSI_LG is assumed to be composed of one semiconductor package, OMD is assumed to be composed of one module printed circuit board, and LSI_LG and OMD are assumed to be mounted on a printed circuit board corresponding to the interface card IFC or the switch card SWC of FIG. 1B and are connected by wirings on the printed circuit board. The logical operation processor circuit LGC carries out a predetermined protocol processing required for an upper layer of communication. The transmission speed converter circuit SDC1 converts a transmission speed of signals input to or output from LGC and a transmission speed of signals input to or output from the outside of the logical device LSI_LG (i.e., OMD).

The optical element block OBK includes a laser diode LD which carries out output to a transmitting optical communication line OFtx and a photodiode PD which converts optical signals input from a receiving optical communication line OFrx to electric signals (current signals). Each of LD and PD is composed of, for example, an individual semiconductor chip, and a plurality of LDs and PDs are present in practice so as to correspond to the number of communication channels. The analog front end block AFEBK includes a laser diode driver circuit LDD which drives LD, a control circuit LDDCTL which controls driving power of LDD, and a transimpedance amplifier circuit TIA which amplifies a current signal from PD and converts the signal to a voltage signal. AFEBK herein is composed of one semiconductor chip. The transmission speed converter circuit SDC2 converts the transmission speed of the signals input/output to/from AFEBK (LDD and TIA) and the transmission speed of the signals input/output to/from the outside of the optical communication module OMD (i.e., LSI_LG).

The transmission speed converter circuits SDC1 and SDC2 are called, for example, SerDes (Serializer/Deserializer) and, specifically, they convert a bus width and a transmission speed on the bus. For example, the electric signals of 10 Gbps×10 (10 channels) are transmitted/received between SDC1 and SDC2, and SDC2 converts the electric signals to those of 25 Gbps×4 (4 channels) and transmits/receives the signals to/from AFEBK. In this case, the communication between the cards (IFC, SWC) of FIG. 1B via the optical communication lines OF is also carried out by 25 Gbps×4 channels. The part between SDC1 and SDC2 can have a wiring length of, for example, on the order of several tens of centimeters on the card as is understood from FIG. 1B, etc.; therefore, it cannot be said that realization of a transmission speed of, for example, 25 Gbps is easy from the viewpoint of power consumption, waveform quality, etc. Therefore, the bus width is widened to lower the transmission speed in this example; however, if LSI_LG and OMD can be wired to each other by a short-distance wiring, for example, by integration of the semiconductor chips, such transmission speed conversion is not particularly required.

Figure 3:
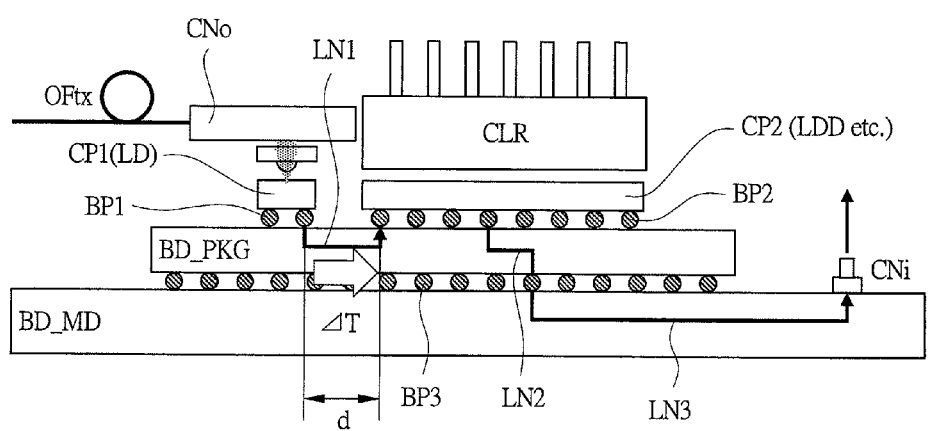
FIG. 3 is a cross-sectional view illustrating an example of a schematic mounting structure about a laser diode and a laser diode driver circuit of the optical communication module of FIG. 2.

FIG. 3 is a cross-sectional view illustrating an example of a schematic mounting structure about the laser diode LD and the laser diode driver circuit LDD of the optical communication module OMD of FIG. 2. FIG. 3 illustrates an example in which a semiconductor chip CP1 on which the laser diode LD explained by FIG. 2 is formed and a semiconductor chip CP2 on which the laser diode driver circuit LDD, etc. are formed are mounted on one package printed circuit board BD_PKG. CP1 (LD) is connected to a first surface of BD_PKG via bumps BP1 formed on the first surface, and CP2 (LDD, etc.) is connected to the first surface of BD_PKG via bumps BP2 formed on the first surface. Part of BP1 and part of BP2 are connected via a wiring (typically, copper wiring) LN1 in BD_PKG, thereby electrically connecting CP1 (LD) and CP2 (LDD, etc.) to each other.

BD_PKG is connected to a first surface of a module printed circuit board BD_MD via bumps BP3 formed on a second surface. Thus, part of BP2 is connected to part of BP3 via wiring LN2 in BD_PKG. A connector CNi is provided on the first surface of BD_MD, and part of BP3 is connected to CNi via wiring LN3, which is in BD_MD. Thus, CP2 (LDD, etc.) and CNi are electrically connected to each other via LN2 and LN3. The electric signals from the transmission speed converter circuit SDC2 of FIG. 2 are input to above-described CNi. CP1 (LD) outputs laser light in accordance with the drive signals from LDD, and the laser light is output to the optical communication line OFtx via the optical connector CNo including a collimator lens, a collective lens, etc. Moreover, herein, cooling means CLR is installed on a second surface of CP2 (LDD, etc.). Typical examples of CLR include a heatsink and a water-cooling device.

A main feature of FIG. 3 is that the chip CP1 on which the laser diode LD is formed and the chip CP2 on which the laser diode driver circuit LDD, etc. are formed are mounted on the same package printed circuit board BD_PKG to be close to each other and are connected to each other by the wiring LN1. A wiring length d of LN1 is a short length of, for example, 1 mm to 2 mm. LN1 is typically a wiring which transmits drive signals from LDD to LD or a wiring which supplies a power-supply voltage of a high-potential side or a low-potential side; however, LN1 is not necessarily limited thereto, but is some sort of wiring of one or more lines.

The wiring LN1 plays the role of transmitting a temperature variation of the laser diode LD to the semiconductor chip CP2. As illustrated in FIG. 2, CP2 includes the control circuit LDDCTL which controls the laser diode driver circuit LDD, and a main feature of LDDCTL is to include temperature detecting means, which will be later described in detail. LDD drives LD by the magnitude of the current to which the detection result of the temperature detecting means is reflected, instead of the monitoring photodiode PDm described in FIG. 15, etc. In this process, the temperature variation of LD can be transmitted to CP2 at a high accuracy (high sensitivity) by reducing the wiring length of LN1 as much as possible. In other words, the temperature of LD is detected by utilizing the wiring, which is shortened by downsizing (high-density packaging), to control LDD.

Upon the temperature detection, in some cases, the temperature detecting means may be affected by heat generation of LDD, etc. and not able to highly precisely detect the temperature variations of LD. Therefore, in this case, the influence of heat generation of LDD, etc. is reduced by providing cooling means CLR. If LN1 is the wiring of drive signals, the wiring width thereof is, for example, 100 µm to 300 µm although it is not particularly limited to this. The thicker the wiring width, the more desirable it is from the viewpoint of heat conduction; however, on the other hand, the transmission band may be reduced along with an increase in a parasitic capacity component, etc. together with the increase in the mounting area thereof; therefore, the width is determined depending on trade-off of the wiring width and transmission band.

Figure 15:
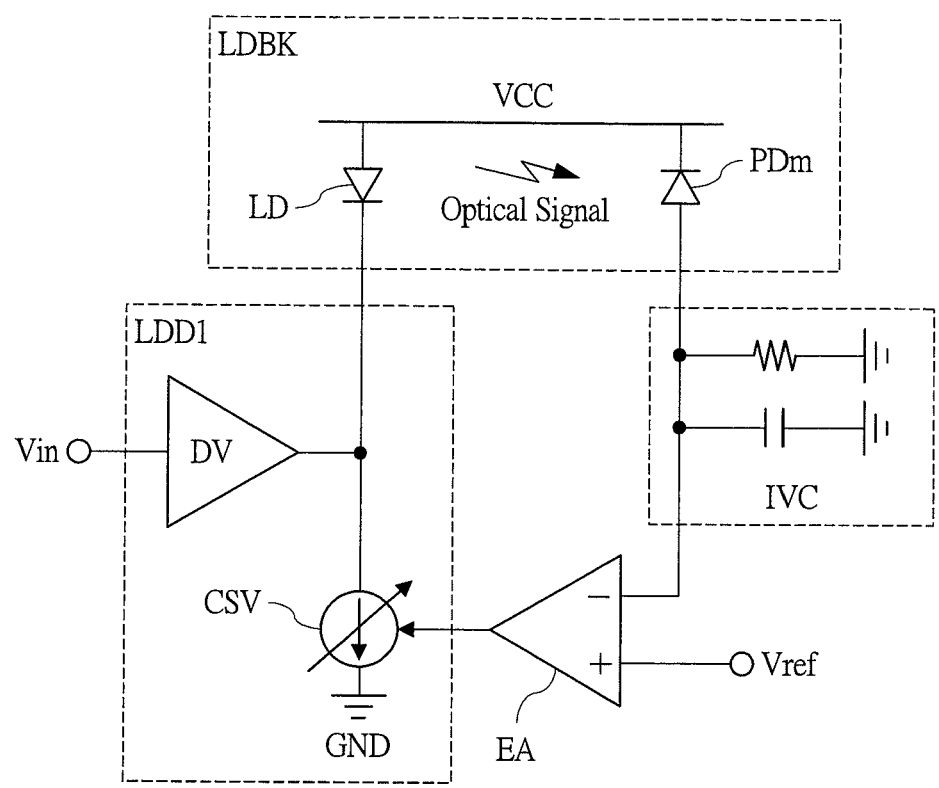
FIG. 15 is a circuit block diagram illustrating an example of a configuration of an optical communication module studied as a premise of the present invention.

When the configuration example as illustrated in FIG. 3 is used in the above described manner, there is no need to provide the monitoring photodiode PDm in a vicinity of the laser diode LD as described by FIG. 15; therefore, a plurality of LDs can be mounted at a high density. By virtue of this, downsizing (high-density packaging) and cost reduction can be achieved along with reduction in the number of parts. Furthermore, as described above, performance, etc. of an existing communication device can be enhanced at low cost by modifying the existing communication device using copper wiring cables or the like (in other words, by replacing the input/output interface part with the optical communication module OMDi and the optical connector CNo of FIG. 1B). In order to detect the temperature variations of LD at a higher accuracy (higher sensitivity), for example, it is also advantageous to use an electrically-conductive grille or the like, which is known for a material having a high thermal (heat) conductivity, to the parts around the bumps BP1 and BP2 connected to the wiring LN1.

Figure 4:
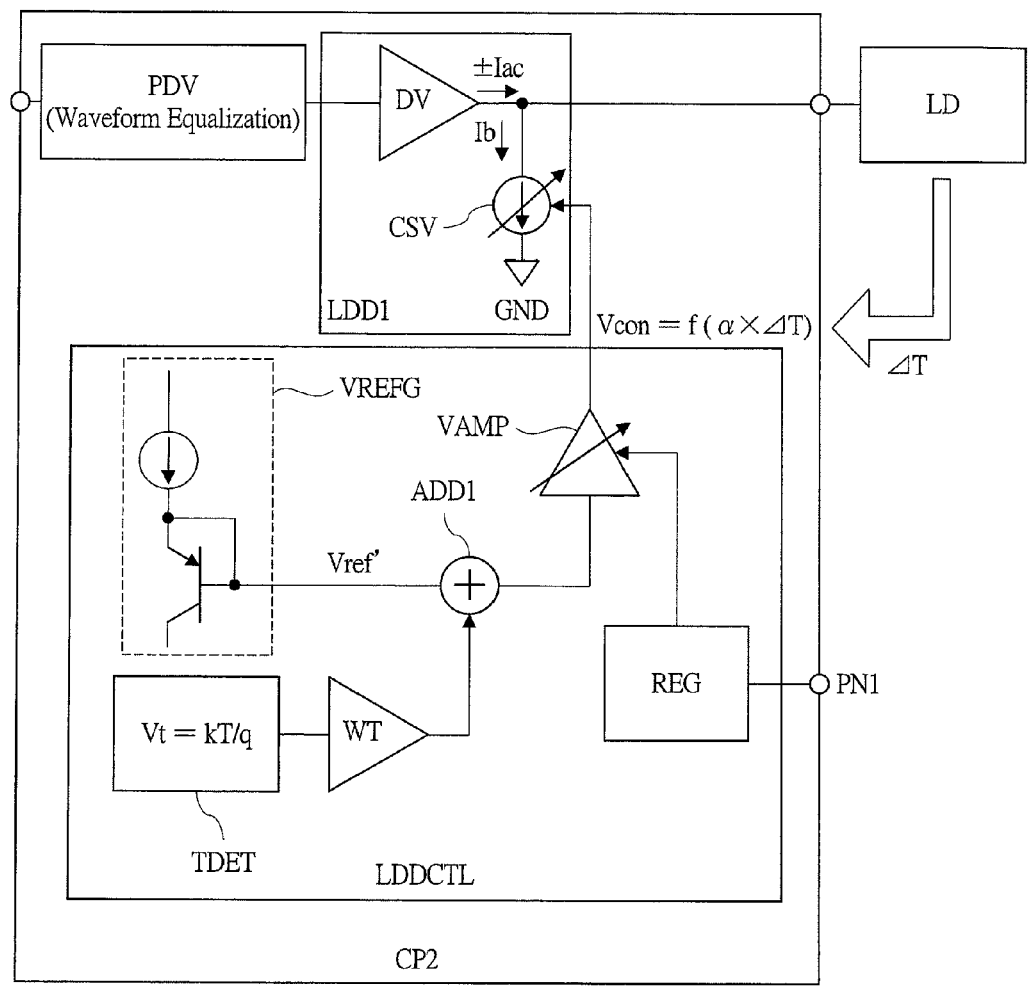
FIG. 4 is a block diagram illustrating a main circuit configuration example of a semiconductor chip including the laser diode driver circuit, etc. of FIG. 3.

FIG. 4 is a block diagram illustrating a main circuit configuration example of the semiconductor chip CP2 including the laser diode driver circuit LDD, etc. in FIG. 3. In the semiconductor chip CP2 illustrated in FIG. 4, a printer driver circuit PDV, the laser diode driver circuit LDD1, and the control circuit LDDCTL are formed. PDV carries out waveform equalization of the signals input via the transmission speed converter circuit SDC2 of FIG. 2. LDD1 includes a driver circuit DV and a variable current source CSV provided between an output node of DV and a ground power-supply voltage GND. CSV generates a bias current Ib having magnitude corresponding to a control signal Vcon from LDDCTL. An output signal of PDV is input to DV, and DV adds an alternating current (±Iac), which is corresponding to magnitude of the input signal, to Ib. The laser diode LD is driven by (Ib±Iac).

The control circuit LDDCTL is provided with a reference voltage generator circuit VREFG, a temperature detector TDET, a weighting circuit WT, an adder circuit ADD1, a variable amplifier circuit VAMP, and a setting register circuit REG. VREFG generates a reference voltage (offset voltage) Vref not dependent on the temperature. TDET has a function of detecting the temperature variation ΔT of the above-described laser diode LD and generates a temperature detection voltage which is increased in proportion to the temperature. WT subjects the temperature detection voltage to a predetermined weighting. ADD1 adds Vref to an output of WT. VAMP has a gain corresponding to the set value of REG, amplifies the addition result from ADD1, and outputs a control voltage Vcon to the variable current source CSV. As a result, Vcon becomes a function using, as a variable, a value obtained by multiplying the temperature variation ΔT of LD by a predetermined coefficient α. The set value of REG can be set, for example, via an external terminal PN1. Above-described REG is provided for correcting the characteristic variations of each element of LD.

Figure 5:
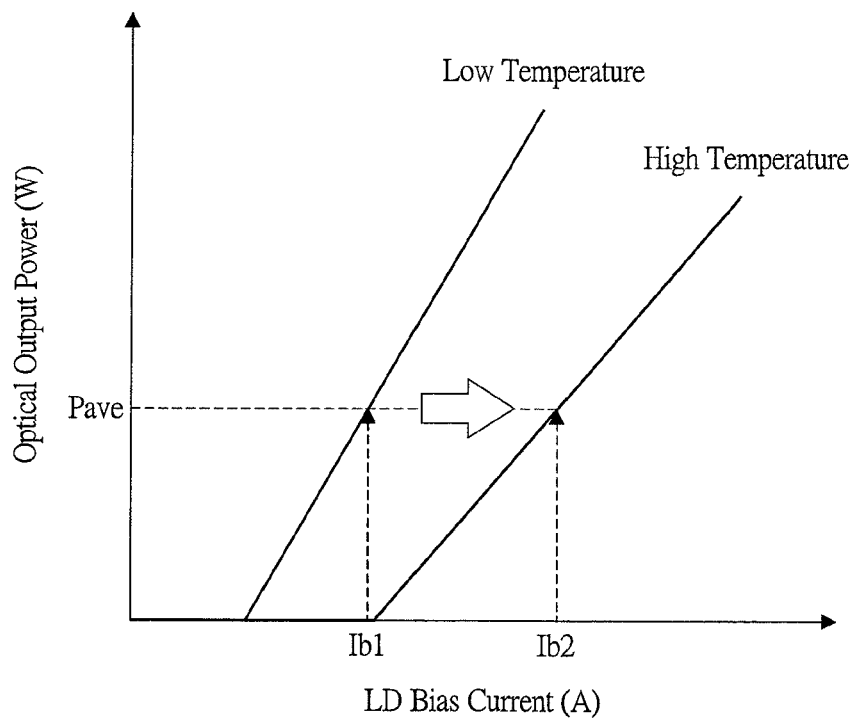
FIG. 5 is an explanatory drawing illustrating an operation example of the control circuit of FIG. 4.

FIG. 5 is an explanatory drawing illustrating an operation example of the control circuit LDDCTL of FIG. 4. As illustrated in FIG. 5, the higher the temperature, the larger the current (bias current Ib) required by the laser diode LD in order to obtain constant optical output power. Therefore, if a bias current Ib1 is required to obtain certain average optical output power Pave at a low temperature, the same Pave can be obtained at a high temperature when a bias current Ib2 larger than Ib1 is controlled to flow. Therefore, the variable current source CSV is controlled by the control voltage Vcon, which is proportional to the temperature variation ΔT, by using LDDCTL as illustrated in FIG. 4.

Note that, the temperature detector TDET of FIG. 4 is not required to detect the absolute value of the temperature of LD, but is required to detect the temperature variation ΔT with a certain level of sensitivity when the temperature variation ΔT is relatively generated. The sensitivity of the temperature variation ΔT can be lowered depending on, for example, thermal conductivity of the wiring LN1 of FIG. 3; however, if there is a certain level of sensitivity, the temperature can be corrected to magnitude corresponding to the actual temperature variation ΔT (° C.) by a weighting amount by the weighting circuit WT. Moreover, also in terms of the accuracy of temperature detection, the accuracy as high as that of the transmission of a long distance on the order of, for example, kilometers is not required in the case of the optical communication device as illustrated in FIGS. 1A and 1B since the transmission therein is a short-distance transmission on the order of several tens of centimeters to meters.

Figure 6:
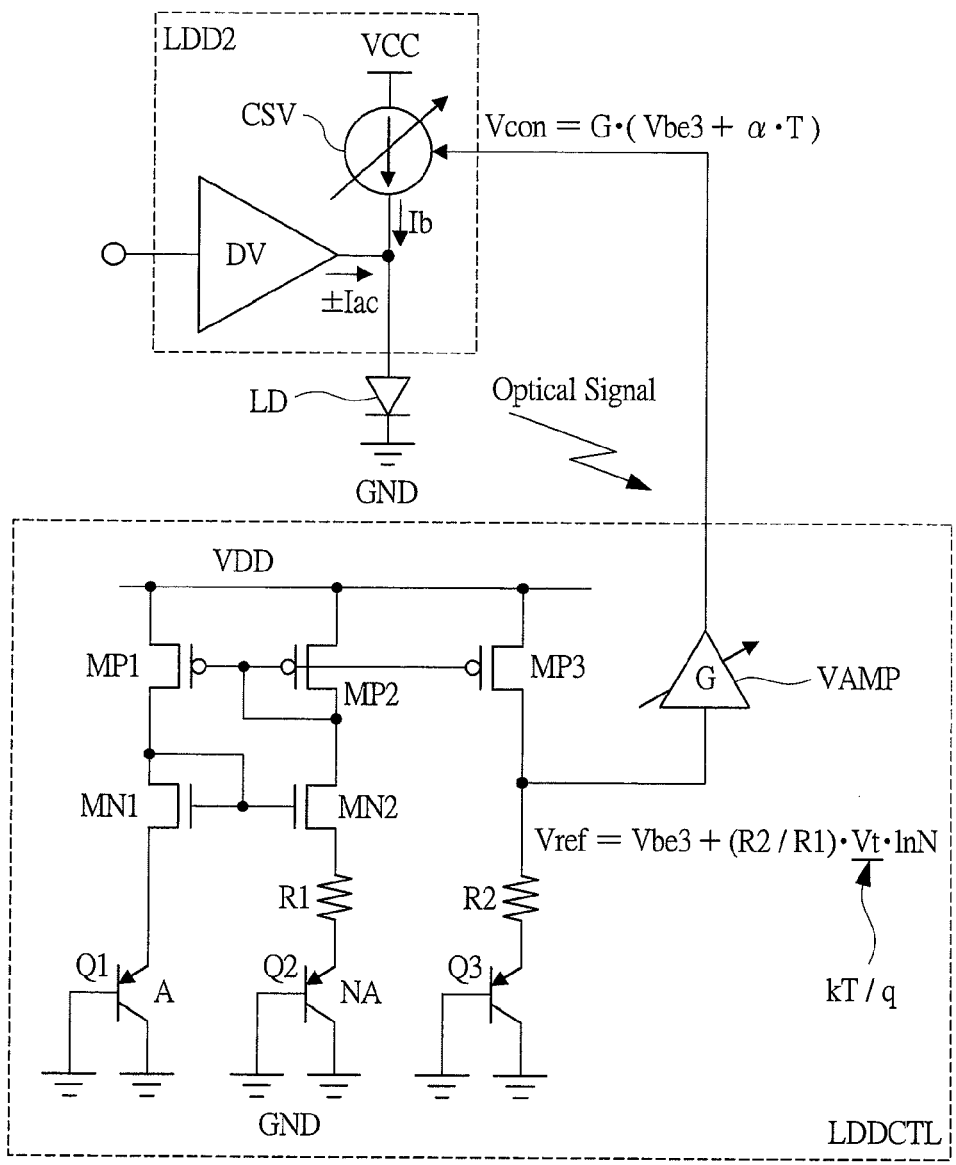
FIG. 6 is a circuit diagram illustrating a further detailed configuration example of the control circuit of FIG. 4.

FIG. 6 is a circuit diagram illustrating a further detailed configuration example of the control circuit LDDCTL of FIG. 4. The control circuit LDDCTL illustrated in FIG. 6 includes NMOS transistors MN1 and MN2, PMOS transistors MP1 to MP3, pnp-type bipolar transistors Q1 to Q3, resistances R1 and R2, and the variable amplifier circuit VAMP. The sources of MP1 to MP3 are commonly connected to a power-supply voltage VDD, and the gates of MP1 to MP3 are commonly connected with the drain of MP2, thereby forming a current mirror circuit. The drains of MN1 and MN2 are connected to the drains of MP1 and MP2, respectively, and the gates of MN1 and MN2 are commonly connected with the drains, thereby forming a current mirror circuit. An equal current flows to MN1 and MN2 because of the current mirror circuit of MP1 and MP2; therefore, the source electric potential of MN1 and MN2 are set to be equal.

The bases and collectors of Q1 to Q3 are connected to the ground power-supply voltage GND so that each of Q1 to Q3 functions as a diode. The emitter (anode) of Q1 is connected to the source of MN1, and the emitter (anode) of Q2 is connected to the source of MN2 via R1. Herein, the area of Q1 is assumed to be A, and the area of Q2 is assumed to be N·A; wherein, when the same current is caused to flow to Q1 and Q2, the value of the difference between the forward voltage generated by Q1 and the forward voltage generated by Q2 becomes $(kT/e) \cdot \ln(N)$ which is known to have a positive temperature characteristic {k: Boltzmann constant, e: charge amount of electrons, T: temperature}. This difference value is applied to both ends of R1; therefore, a current having a positive temperature characteristic flows to MP3 via the current mirror circuit of MP2 and MP3. The drain of MP3 is connected to the emitter (anode) of Q3 via R2. Therefore, a voltage Vref generated at the drain of MP3 becomes as expressed by Expression (1).

$$Vref = Vbe3 + (R2/R1) \cdot (kT/e) \cdot \ln(N) \qquad (1)$$

In Expression (1), the first term (Vbe3) of the right side is a forward voltage of Q3 (diode) and is known to have a negative temperature characteristic. On the other hand, the second term of the right side has the positive temperature characteristic as described above. Such a circuit is called, for example, bandgap reference circuit etc., and the current which flows to MP3 is called, for example, a PTAT (Proportional To Absolute Temperature) current. The bandgap reference circuit is usually used for generating a reference voltage not dependent on temperature; however, herein, the bandgap reference circuit generates a reference control voltage (Vref) which increases in proportion to the temperature by carrying out adjustment so that the temperature coefficient (for example, R2/R1) of the second term of the right side of Expression (1) becomes larger than the temperature coefficient of the first term. The Vref obtained in this manner is conceptually equal to the result of addition of the reference voltage (offset voltage) Vref' not dependent on the temperature (corresponding to the cancel-out amount of the temperature coefficients of the first term and the second term of Expression (1)) and the output of the weighting circuit WT (corresponding to the excessive amount of the temperature coefficient of the second term of Expression (1)) as illustrated in FIG. 4.

The variable amplifier circuit VAMP amplifies the reference control voltage (Vref) by a gain G and supplies the amplification result to a laser diode driver circuit LDD2 as the control voltage Vcon ($=G \cdot (Vbe3 + \alpha \cdot T)$). Different from the laser diode driver circuit LDD1 of FIG. 4 (FIG. 15), in LDD2, the variable current source CSV controlled by Vcon is provided between the output node of the driver circuit DV and the power supply voltage VCC. In other words, in the case of FIG. 6, the anode and the cathode of the laser diode LD are connected to the output node of DV and the ground power-supply voltage GND, respectively; however, in the case of FIG. 15, the anode and the cathode of LD are connected to the power-supply voltage VCC and the output node of DV, respectively. Usage of these is arbitrarily selected in accordance with the specifications of LD, and the specifications of LD are not particularly limited in the present embodiment.

Figure 7A:
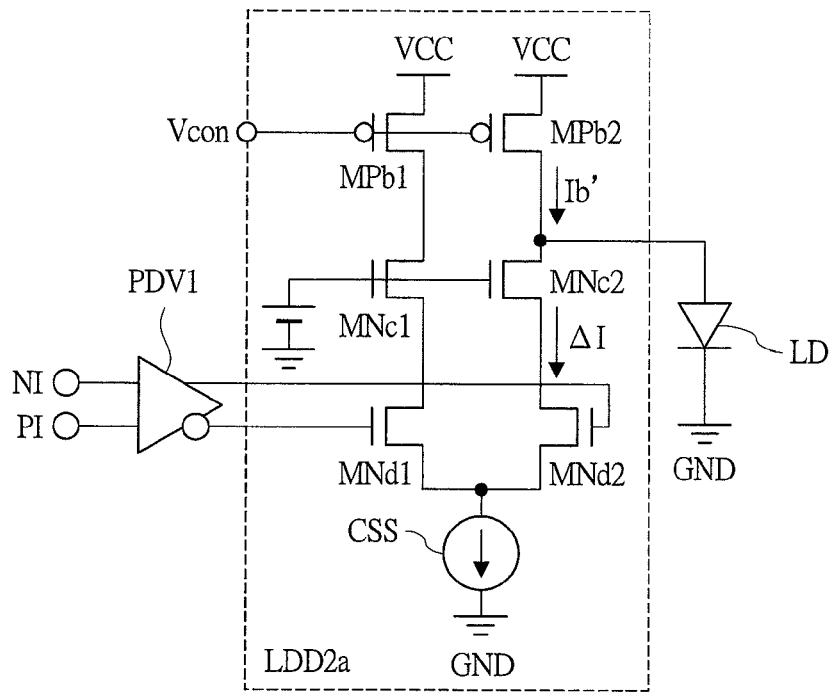
FIG. 7A illustrates a detailed configuration example of the laser diode driver circuit of FIG. 6, being a circuit diagram using a differential type.
Figure 7B:
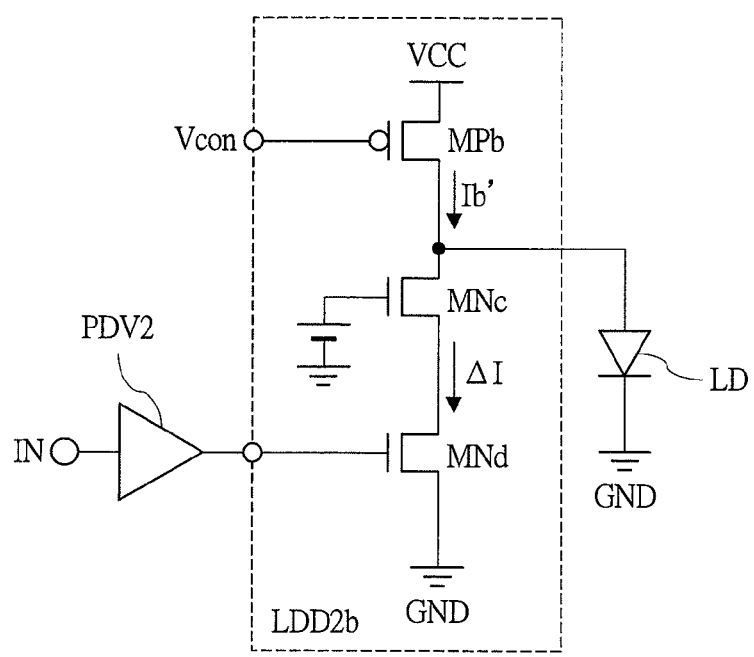
FIG. 7B illustrates a detailed configuration example of the laser diode driver circuit of FIG. 6, being a circuit diagram using a single-end type.

FIGS. 7A and 7B illustrate detailed configuration examples of the laser diode driver circuit LDD2 of FIG. 6. FIG. 7A is a circuit diagram of a case of using a differential type, and FIG. 7B is a circuit diagram of a case of using a single-end type. A laser diode driver circuit LDD2a illustrated in FIG. 7A is composed of NMOS transistors MNd1, MNd2, MNc1, and MNc2, PMOS transistors MPb1 and MPb2, and a constant current source CSS. MNd1 and MNd2 form a differential pair, sources of MNd1 and MNd2 are commonly connected, and a differential output signal from a pre-driver circuit PDV1 is input to each of the gates thereof. CSS is connected between the common source node of MNd1 and MNd2 and GND. MNc1 and MNc2 are grounded-gate transistors, and the sources thereof are cascode-connected to the drains of MNd1 and MNd2, respectively. The sources of MPb1 and MPb2 are connected to the power-supply voltage VCC, the drains thereof are connected to the drains of MNc1 and MNc2, respectively, and the control voltage Vcon is applied to the gates thereof. The laser diode LD is connected between the drain of MPb2 (MNc2) and GND.

In such a configuration, when a current flowing to MPb2 is Ib' and a current flowing to MNd2 is $\Delta I$, $\Delta I$ becomes a current obtained by adding an alternating current ($\pm Iac$), which is varied in accordance with the output voltage of PDV1, to the current of CSS/2. Therefore, the current flowing to LD becomes $(Ib' - (CSS/2) \pm Iac)$, and the magnitude of Ib' is controlled in accordance with the control voltage Vcon (i.e., temperature). Note that MNc1 and MNc2 are provided in order to improve the operating frequency band.

On the other hand, a laser diode driver circuit LDD2b illustrated in FIG. 7B is composed of NMOS transistors MNd and MNc and a PMOS transistor MPb. The source of MNd is connected to GND, and an output signal from a pre-driver circuit PDV2 is input to the gate of MNd. MNc is a grounded-gate transistor, and the source thereof is cascode-connected to the drain of MNd. The source of MPb is connected to VCC, the drain of MPb is connected to the drain of MNc, and the control voltage Vcon is applied to the gate of MPb. The laser diode LD is connected between the drain of MPb (MNc) and GND. In this case, the current $\Delta I$ ($=Ibs \pm Iac$) flows to MNd in accordance with an output voltage of PDV2, wherein the current AI is obtained by superimposing the bias component (Ibs) thereof and the alternating-current component ($\pm Iac$), and the current flowing to MPb is Ib'; in this case, the current which flows to LD becomes ($Ib' - Ibs \pm Iac$).

Figure 8A:
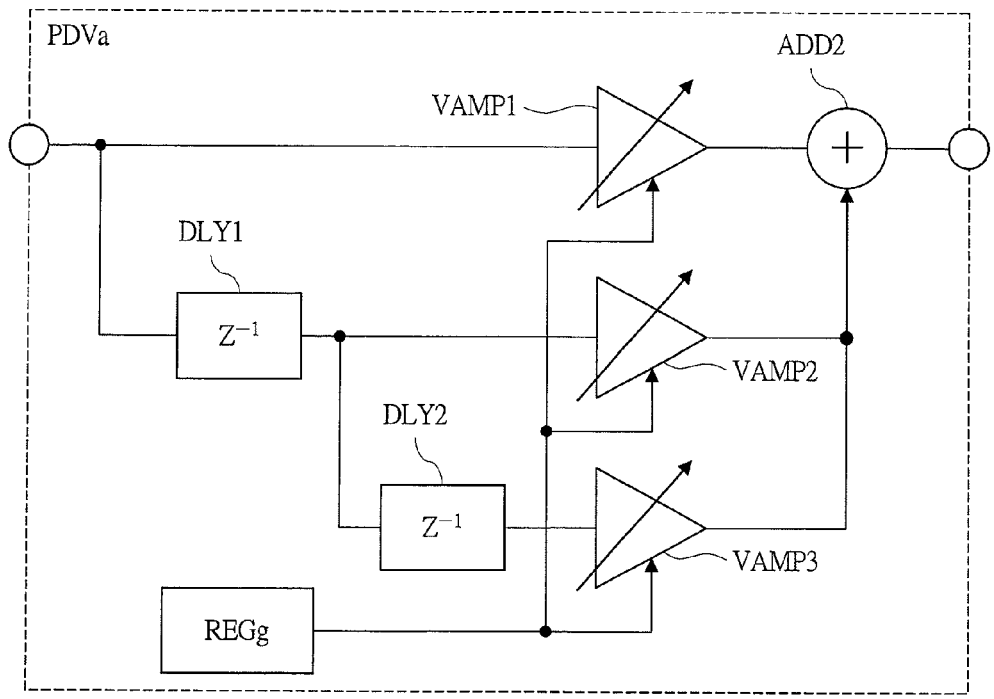
FIG. 8A is a circuit block diagram illustrating a configuration example of a pre-driver circuit PDV of FIG. 4 different from FIG. 8B.
Figure 8B:
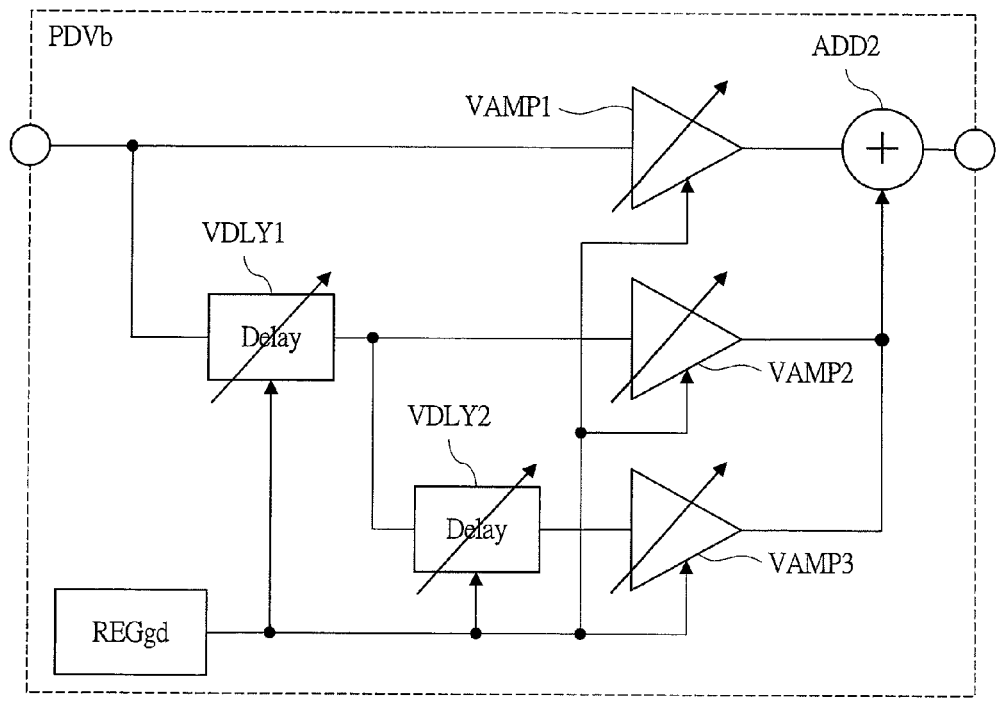
FIG. 8B is a circuit block diagram illustrating a configuration example of a pre-driver circuit PDV of FIG. 4 different from FIG. 8A.

FIGS. 8A and 8B are circuit block diagrams illustrating mutually different configuration examples of the pre-driver circuit PDV of FIG. 4. A pre-driver circuit PDVa is provided with, for example, three variable amplifier circuits VAMP1 to VAMP3, two delay circuits DLY1 and DLY2, and an adder circuit ADD2. DLY1 delays the signals input to PDVa, and DLY2 delays the output signals of DLY1. VAMP1 amplifies signals input to PDVa, VAMP2 amplifies output signals of DLY1, and VAMP3 amplifies output signals of DLY2. ADD2 adds output signals of VAMP1 to VAMP3 and outputs a result to the laser diode driver circuit LDD. Herein, the gains of VAMP1 to VAMP3 can be set by a register circuit REGg. On the other hand, a pre-driver circuit PDVb of FIG. 8B has a configuration in which the delay circuits DLY1 and DLY2 of FIG. 8A are replaced by variable delay circuits VDLY1 and VDLY2. Gains of VAMP1 to VAMP3 and delay amounts of VDLY1 and VDLY2 can be set by a register circuit REGgd.

Such pre-driver circuits PDVa and PDVb are so-called waveform equalizer circuits. Shapes of output waveforms can be adjusted like, for example, intensification of the rising/falling edges of the output waveforms, by arbitrarily setting the gains of VAMP1 to VAMP3 and, in addition to the delay amounts of VDLY1 and VDLY2. The voltage signals which have undergone the waveform equalization are converted to waveform-equalized current signals via, for example, the laser diode driver circuit LDD as illustrated in FIG. 7A or 7B and are supplied to the laser diode LD.

Herein, with reference to the configuration example of FIG. 3, it is desirable to widen the width of the wiring LN1 to some extent as described above in order to increase the thermal conductivity. However, when the wiring width is widened, waveform distortion typified by blunting of the rising/falling edges occurs along with increase in the parasitic capacity component, etc. thereof. When a waveform equalizer circuit as illustrated in FIG. 8A or 8B is used in that case, the distortion can be corrected in advance, and the wiring width of LN1 can be widened to some extent as a result.

As described above, when the optical module and the optical communication device of the present first embodiment are used, typically, downsizing and cost reduction of optical modules and optical communication devices can be realized.

Second Embodiment

Figure 9:
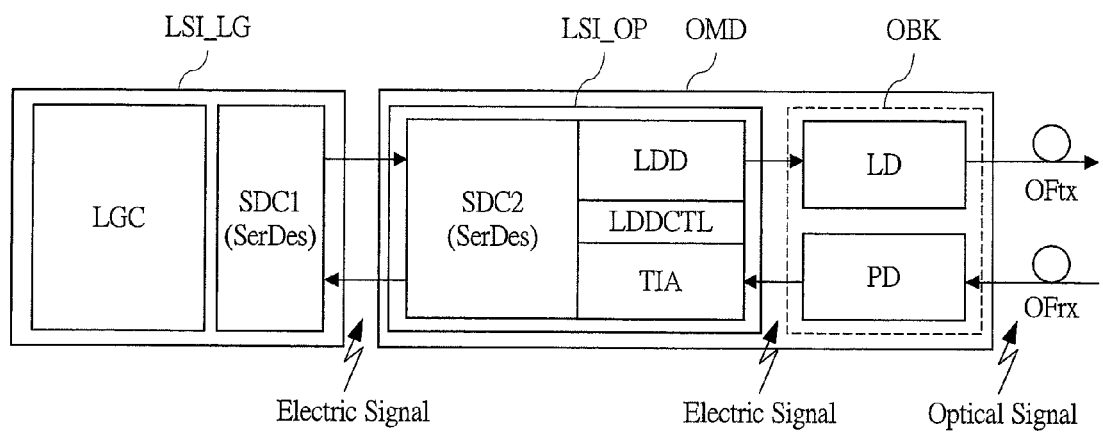
FIG. 9 is a block diagram illustrating a configuration example of the logical device and the optical communication module of FIGS. 1A and 1B in an optical communication device according to a second embodiment of the present invention.

In a present second embodiment, modification examples of FIGS. 2 and 3 described in the first embodiment will be described. FIG. 9 is a block diagram illustrating a configuration example of the logical device LSI_LG and the optical communication module OMD of FIGS. 1A and 1B in an optical communication device according to the second embodiment of the present invention. As compared with the configuration example of FIG. 2, the optical communication device of FIG. 9 is different in the point that the transmission speed converter circuit SDC2, the laser diode driver circuit LDD, the control circuit LDDCTL, and the transimpedance amplifier circuit TIA are formed on one semiconductor chip and that the semiconductor chip forms one optical control device LSI_OP. LSI_OP is a part of the optical communication module OMD as well as the optical element block OBK. The configurations other than that and the operations of the circuits are similar to those in FIG. 2; therefore, detailed descriptions thereof will be omitted.

FIG. 10A is a cross-sectional view illustrating an example of a schematic mounting structure of the optical communication device of FIG. 9, FIG. 10B is a cross-sectional view illustrating a structure example wherein part of the module printed circuit board of FIG. 10A is enlarged, and FIG. 10C is a cross-sectional view illustrating a structure example cut along A-A' of FIG. 10B. Different from the case of FIG. 3, FIG. 10A illustrates an example in which the semiconductor chip CP1 on which the laser diode LD is formed and the above-described optical control device LSI_OP (semiconductor chip CP2') are mounted on one module printed circuit board BD_MD. CP1 (LD) is connected to a first surface of BD_MD via bumps BP1 formed on the first surface, and CP2' (LSI_OP) is connected to the first surface of BD_MD via bumps BP2' formed on the first surface. Part of BP1 and part of BP2' are connected via wiring (typically, copper wiring) LN1' in BD_MD, thereby electrically connecting CP1 (LD) and CP2' (LSI_OP) to each other.

BD_MD is connected to a first surface of a card printed circuit board BD_CD corresponding to any of the cards (IFC, SWC) of FIGS. 1A and 1B via bumps BP3' formed on a second surface of BD_MD. As a result, part of BP2' is connected to part of BP3' via wiring LN2' in BD_MD. On the other hand, the logical device LSI_LG is connected to a first surface of a package printed circuit board BD_PKG2 via bumps BP5' formed on the first surface. BD_PKG2 is connected to the first surface of the card printed circuit board BD_CD via bumps BP4' formed on a second surface of BD_PKG2. As a result, part of BP5' is connected to part of BP4' via wiring LN4' in BD_PKG2.

Moreover, part of BP3' is connected to part of BP4' via wiring LN3' in BD_CD. As a result, LSI_OP and LSI_LG are electrically connected to each other. CP1 (LD) outputs laser light in accordance with a drive signal from LDD, and the laser light is output to the optical communication line OFtx via the optical connector CNo including a collimator lens, a collective lens, etc. Moreover, herein, a cooling means CLR is installed on the second surface of CP2' (LSI_OP). Typical examples of CLR include a heatsink and a water-cooling device.

Herein, the wiring LN1' between CP1 (LD) and CP2' (LSI_OP) is provided with ground wiring LNgnd with insulating layers ISL interposed in the upper and lower layers thereof as illustrated in FIG. 10B. As described by FIG. 2, etc., a plurality of LN1' (a plurality of channels) are present in practice to correspond to the number of CP1 (LD); and, as illustrated in FIG. 10C, the ground wiring LNgnd is also provided between the wiring (herein, between LN1'_CH1 and LN1'_CH2) corresponding to the channels. When so-called coplanar lines or the like are used in this manner, the mutual inductance component, etc. between the adjacent channels can be reduced, and the crosstalk between the adjacent channels can be reduced.

For example, effects as mentioned below can be obtained b using the above-described optical communication device of the second embodiment. First, the wiring LN1' of FIG. 10A has a function of transmitting the temperature variation of the laser diode LD to the temperature detector in the control circuit LDDCTL in the same manner as the wiring LN1 of FIG. 3. Therefore, in the same manner as the first embodiment, typically, downsizing or cost reduction of the optical module and the optical communication device can be realized. Moreover, the laser diode driver circuit LDD, the transmission speed converter circuit SDC2, etc. are formed on the single semiconductor chip CP2'. Therefore, compared with the case of FIGS. 2 and 3, further downsizing (cost reduction in some cases) of the optical communication module and the optical communication device can be realized, and power consumption can be reduced in addition to that. In other words, input/output buffers having comparatively high drive power for communication between chips have to be provided in the chips if SDC2, LDD, etc. are on different chips; however, when they are on the same chip, the buffers can be reduced. Moreover, even in the case in which they are on the same chip (CP2') because of the viewpoint of power consumption, generated heat is not so large compared with the semiconductor chip CP2 of FIGS. 2 and 3, and the influence thereof on the temperature detector TDET in the control circuit LDDCTL does not particularly cause problems.

Third Embodiment

Figure 11:
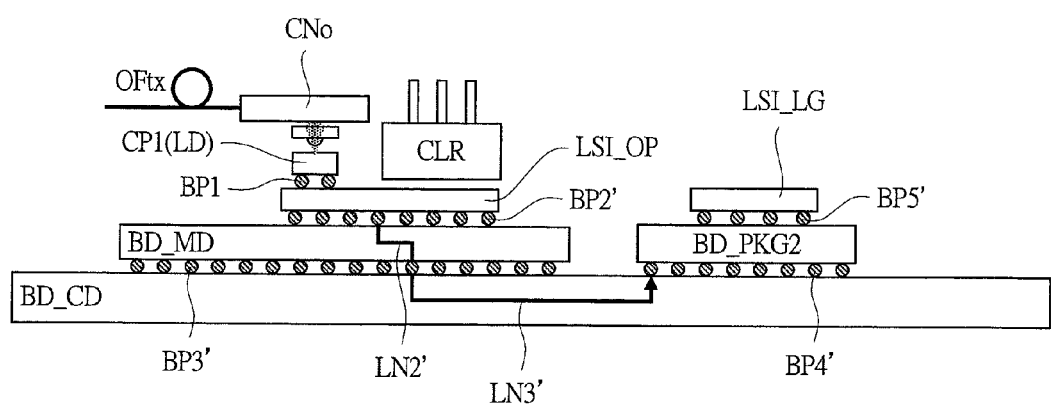
FIG. 11 is a cross-sectional view illustrating an example of a schematic mounting structure of an optical communication device according to a third embodiment of the present invention.

In a third embodiment, the modification example of FIGS. 10A to 10C described in the second embodiment will be further described. FIG. 11 is a cross-sectional view showing an example of the schematic mounting structure of an optical communication device according to the third embodiment of the present invention. Compared with the configuration example of FIGS. 10A to 10C, the configuration example of FIG. 11 is different in the point that the semiconductor chip CP1 (LD) on which the laser diode LD is formed is flip-chip-connected onto the optical control device LSI_OP. The configurations other than that are similar to that of FIGS. 10A to 10C; therefore, detailed descriptions thereof will be omitted.

In the same manner as the configuration example of FIGS. 10A to 10C, LSI_OP is connected to the first surface of the module printed circuit board BD_MD via the bumps BP2' formed on the first surface. However, different from the configuration example of FIGS. 10A to 10C, LSI_OP has electrodes also on the second surface thereof, and the bumps BP1 of CP1 (LD) are flip-chip-connected to the electrodes. Moreover, the cooling means CLR is mounted on the second surface except for the area on which CP1 (LD) is mounted. For example, when LSI_OP is a semiconductor chip, such a structure having electrodes on both surfaces can be realized by using through silicon vias (TSV), etc. LSI_OP has electrodes on both surfaces in this case; however, if the electrodes are provided only on one surface, for example, part of the electrodes may be flip-chip-connected to the bumps of CP1 (LD), and the other electrodes may be configured to be connected to BD_MD by wire bonding.

Figure 12:
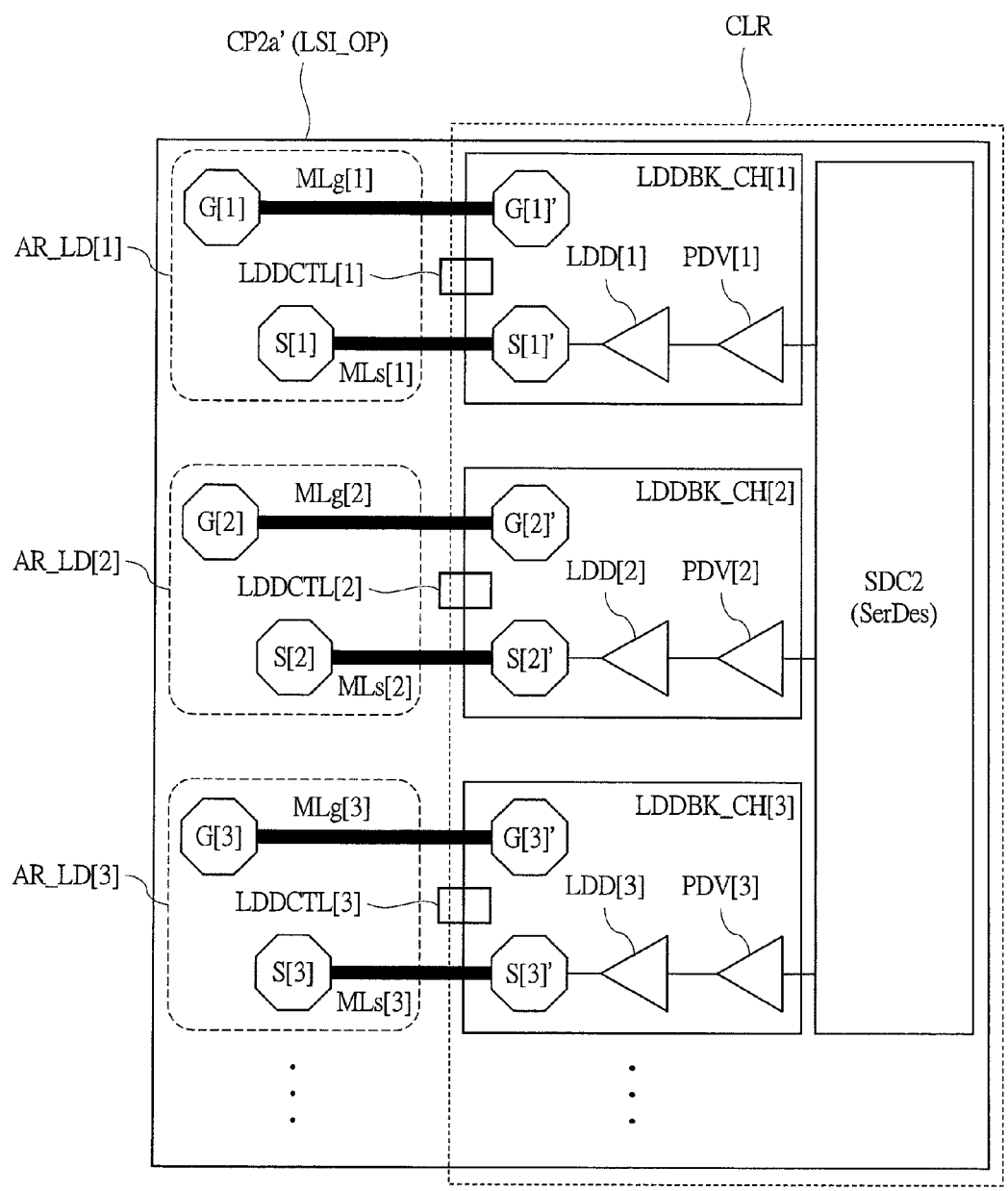
FIG. 12 is a plan view illustrating an example of a schematic layout configuration of part of an optical control device of FIG. 11.

FIG. 12 is a plan view illustrating an example of a schematic layout configuration of part of the optical control device LSI_OP in FIG. 11. LSI_OP illustrated in FIG. 12 is composed of, for example, a single semiconductor chip CP2a' and is provided with a plurality of laser diode driver circuit blocks LDDBK_CH[1], LDDBK_CH[2], . . . , a plurality of laser diode mounting areas AR_LD[1], AR_LD[2], . . . , the transmission speed converter circuit SDC2, etc. A reference electrode G [n] and a signal electrode S[n] are formed in each AR_LD[n] (n=1, 2, . . . ) and sequentially arranged and disposed in a first direction along a first side of the semiconductor chip CP2a'. A reference electrode G[n]', a signal electrode S[n]', a pre-driver circuit PDV[n], and a laser diode driver circuit LDD[n] are formed in each LDDBK_CH[n] (n=1, 2, . . . ) and are adjacent to AR_LD[n] and sequentially arranged and disposed in the first direction.

The bumps BP1 (see FIG. 11) of the laser diode LD[n] (not illustrated) are connected to the reference electrode G[n] and the signal electrode S[n]. G[n] and G[n]' are connected to each other via metal wiring MLg[n], etc. on CP2a', and S[n] and S[n]' are also connected to each other by metal wiring MLs[n], etc. on CP2a'. When FIG. 7A is taken as an example, G[n] and G[n]' correspond to the cathode node of LD, and S[n] and S[n]' correspond to the anode node of LD. Furthermore, in CP2a', a control circuit LDDCTL[n] is formed at a position close to each of G[n]' and S[n]'. In the example of FIG. 12, each LDDCTL[n] is disposed between the metal wiring MLg[n] of G[n]' and the metal wiring MLs[n] of S[n]'; however, it is not particularly limited to this position, and LDDCTL[n] is only required to be at the position where the temperature variation of G[n]' (MLg) and S[n]' (MLs) can be detected with high sensitivity (high accuracy). However, among the positions, a position that is not affected by the heat generation of LDD[n] as much as possible is desirable.

Herein, in the configuration example of FIG. 12, each laser diode mounting area AR_LD[n] has, although it is not particularly limited thereto, for example, an area of 250 μm×400 μm, and the areas are sequentially disposed at a pitch of 250 μm. Each LDDCTL [n] can be realized by a circuit area of, for example, 50 μm×80 μm. For example, if the monitoring photodiode PDm as illustrated in FIG. 15 is provided, each PDm has a chip size equivalent to that of the laser diode LID, and a mechanism or the like which divides the optical output of LD to that of the PDm side and that of the optical communication line OFtx side is required; therefore, a large mounting area may be required as well as cost increase. Therefore, providing the control circuit LDDCTL instead of PDm like the present embodiment is advantageous.

For example, the effects described below can be obtained by using the optical communication device of the present third embodiment described above. First, the metal wirings MLg and MLs of FIG. 12 have a function of transmitting the temperature variation of the laser diode LD to the temperature detector in the control circuit LDDCTL in the same manner as the wiring LN1, etc. of FIG. 3. Therefore, in the same manner as the case of the first and second embodiments, typically, downsizing or cost reduction of the optical communication module and the optical communication device can be achieved. Moreover, the laser diode driver circuit LDD, the transmission speed converter circuit SDC2, etc. are formed on the single semiconductor chip CP2a'. Therefore, in the same manner as the second embodiment, the optical communication module and the optical communication device can be further downsized (cost is reduced in some cases), and power consumption can be reduced in addition to that.

Furthermore, compared with the wiring LN1' of FIGS. 10A to 10C described in the second embodiment, the wiring length of the metal wiring MLg and MLs can be shortened; therefore, the sensitivity (or accuracy) of the detection in the temperature detector can be increased. Moreover, since the wiring length of MLg and MLs can be shortened, the operating band used when LDD drives LD can be also improved. Herein, the case in which the optical control device LSI_OP is the semiconductor chip CP2a' has been taken as an example; however, the optical control device is not necessarily required to be a semiconductor chip, but may be, for example, a package part having electrodes on both of its surfaces and a semiconductor chip buried in the interior of the package part. Also in this case, although not as much as the case of the semiconductor chip, but the wiring length can be shortened, and similar effects can be obtained.

Fourth Embodiment

Figure 13:
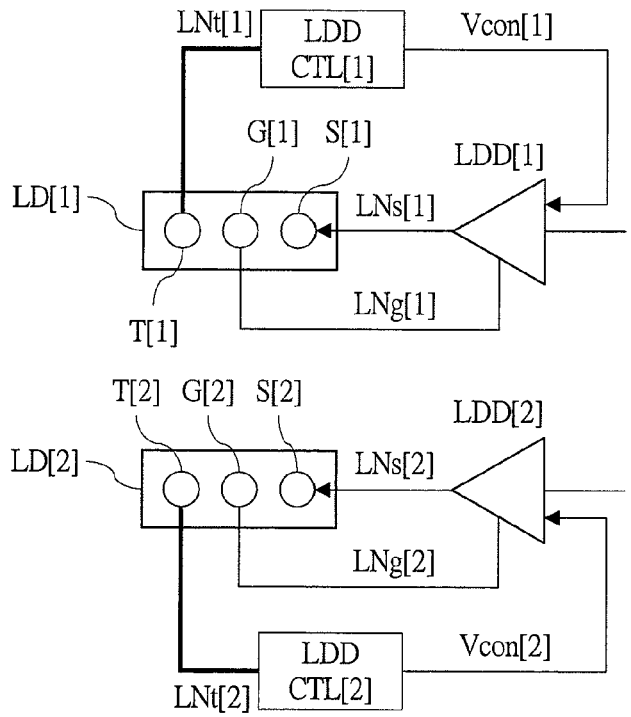
FIG. 13 is a conceptual diagram illustrating an example of a connection configuration of a laser diode driver circuit and a control circuit with respect to a laser diode of an optical communication device according to a fourth embodiment of the present invention.

In a fourth embodiment, a modification example of the laser diode LD illustrated in the third embodiment will be explained. FIG. 13 is a conceptual diagram showing an example of the connection configuration of the laser diode driver circuit and the control circuit with respect to the laser diode of an optical communication device according to the fourth embodiment of the present invention. Different from above-described FIG. 12, etc. of the third embodiment, FIG. 13 is mainly characterized in that each of the laser diodes LD[n] (n=1, 2, . . . ) is provided with a temperature-transmission-dedicated temperature electrode T[n] in addition to the reference electrode G[n] and the signal electrode S[n].

The temperature electrode T[n] is connected to the control circuit LDDCTL[n], which is provided with the temperature detector, via temperature wiring LNt[n]. More specifically, the temperature variation of LD[n] is transmitted by signal wiring LNs[n] and reference wiring LNg[n] between LD[n] and LDD[n] in above-described FIG. 12, etc.; however, herein, the temperature variation is transmitted by LNt[n]. When such a configuration example is used, the wiring width of LNt[n] can be sufficiently widened in consideration of only the thermal conductivity since it is not the drive signal of LD. Moreover, since the operation of supplying a control voltage Vcon[n] from LDDCTL[n] to LDD[n] does not really require high-speed performance, the influence of heat generation from LDD[n] to LDDCTL[n] can be reduced, for example, by increasing the distance therebetween. Therefore, LDDCTL [n] can be disposed at a position which is least affected by heat generation in the semiconductor chip. Therefore, when a packaging density can be ensured along with addition of the temperature electrode T[n], using such a configuration is advantageous.

Fifth Embodiment

Figure 14:
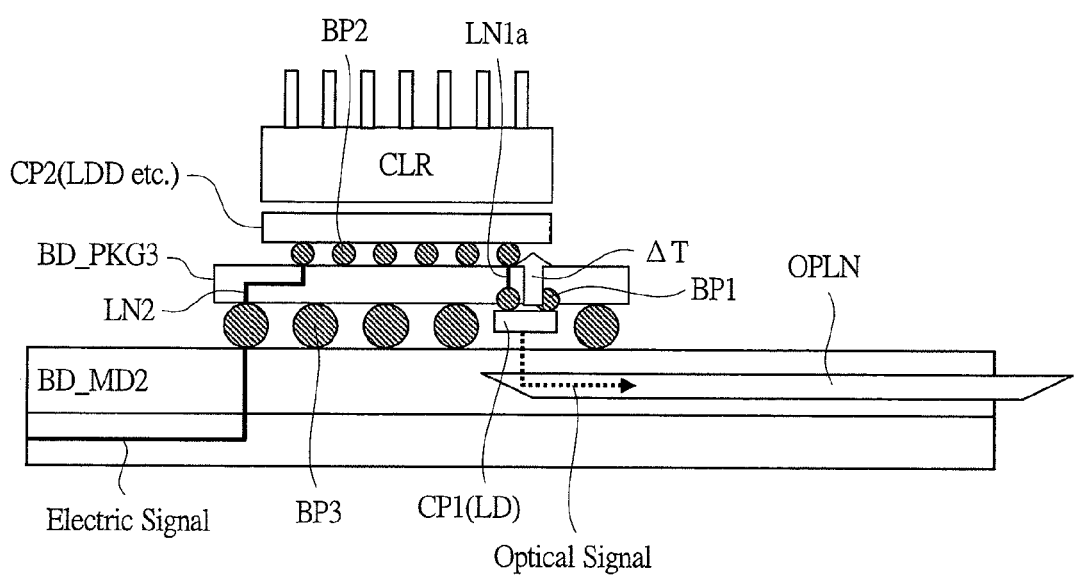
FIG. 14 is a cross-sectional view illustrating an example of a schematic mounting structure of an optical communication device according to a fifth embodiment of the present invention.

In a fifth embodiment, another modification example of FIG. 3 illustrated in the first embodiment will be described. FIG. 14 is a cross-sectional view illustrating an example of a schematic mounting structure of an optical communication device according to the fifth embodiment of the present invention. As compared with the configuration example of FIG. 3, main different points of the configuration example of FIG. 14 are that a first surface of a package printed circuit board BD_PKG3 is connected to a module printed circuit board BD_MD2 via bumps BP3, the semiconductor chip CP1 (LD) is mounted on the first surface via bumps BP1, and an optical waveguide OPLN is formed in BD_MD2.

The bumps BP1 of CP1 (LD) are connected to the bumps BP2 of the semiconductor chip CP2 (LDD, etc.) mounted on a second surface of BD_PKG3 via wiring (via) LN1a in BD_PKG3. Therefore, in the same manner as the case of FIG. 3, the temperature variation ΔT of CP1 (LD) is detected by a temperature detecting means provided in CP2 (LDD) via LN1a. Moreover, the optical output signals from CP1 (LD) enter OPLN in BD_MD2 instead of the optical communication line (optical fiber cable) OFtx illustrated in FIG. 3 and transmitted via OPLN.

In such a configuration example, the mounting space of the semiconductor chip CP1 (LD) is very narrow. Therefore, it is not easy to use the laser diode block LDBK including the monitoring photodiode PDm as described in FIG. 15. Therefore, providing the temperature detecting means in the semiconductor chip CP2 (LDD, etc.) like the present embodiment instead of PDm is advantageous. Herein, for the sake of convenience, the description has been given by the example in which the optical waveguide OPLN is provided in the module printed circuit board BD_MD2. However, the optical waveguide can be configured to be provided in the back plane BKP of FIG. 1B so that optical communication is carried out via the optical waveguide between the cards.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, in the above-described first to fifth embodiments, various embodiments including the package printed circuit board, the module printed circuit board, etc. have been described. However, as a matter of course, the present invention is not limited to these embodiments as long as the semiconductor chip including the laser diode LD and the semiconductor chip including the laser diode driver circuit LDD can be mounted to be close to each other by a certain extent. FIGS. 1A and 1B illustrate an example of the optical communication device which carries out optical communication between the cards; however, as a matter of course, the present invention is not limited to this, but can be applied also to, for example, an optical communication device which carries out optical communication of a comparatively short distance between cards or an optical communication device which carries out optical communication in a single printed circuit board as illustrated in FIG. 14.

FIG. 4 to FIGS. 7A and 7B, etc. described above illustrate the configuration examples that change the bias current IB by reflecting the detection result of the temperature detector. However, it is known that, in the laser diode LD, the inclination of the optical output power with respect to the drive current of LD is changed along with temperature variations as illustrated in FIG. 5, and a configuration can be formed so as to carry out correction including correction of the inclination. In other words, specifically, for example, the gain, etc. of the driver circuit DV of FIG. 4 can be subjected to variable control. Moreover, herein, the average value of the LD drive current (optical output power) is configured to be determined by the bias current Ib; however, it is not necessarily the average value as long as some sort of reference value such as a 'L' level current or a 'H' level current is determined.

The optical communication modules and the optical communication devices according to the present embodiments are particularly advantageous when used in the optical communication modules and the optical communication devices which carry out communications via optical fiber cables inside a device. Also, the optical communication modules and the optical communication devices are not limited to these, but can be widely applied to general products which carry out optical communications by using a laser diode.

What is claimed is:

1. An optical communication module comprising:
a first semiconductor chip having a laser diode outputting an optical signal being formed on the first semiconductor chip;
a first wiring; and
a second semiconductor chip connected to the first semiconductor chip via the first wiring, and having a driver circuit driving the laser diode by a first current being formed on second semiconductor chip, wherein
a driver control circuit, detecting a temperature variation of the first semiconductor chip transferred in heat via the first wiring and correcting the magnitude of the first current based on a detection result, is further formed on the second semiconductor chip;
the driver control circuit includes a temperature detecting circuit generating a first voltage increased in proportion to temperature and generates a driver control voltage obtained by adding a predetermined offset voltage to the first voltage;
the driver circuit includes a variable current source generating a current having a magnitude corresponding to the driver control voltage and determining a reference value of the first current; and
the temperature detecting circuit includes:
first and second diodes having mutually different areas,
a constant current circuit causing an equal current to flow in the first diode and the second diode, and
a first amplifier circuit amplifying a voltage difference between a voltage generated at the first diode and a voltage generated at the second diode so as to output the first voltage.

2. The optical communication module according to claim 1, wherein
the driver control circuit further includes:
a variable amplifier circuit amplifying the driver control voltage by a first gain and supplying the amplified driver control voltage to the variable current source of the driver circuit, and
a setting circuit setting the first gain by a first set value.

3. The optical communication module according to claim 1, wherein
the first wiring is a signal wiring for supplying the first current; and
the driver circuit further includes a waveform equalizer circuit compensating for waveform distortion of the first current generated in the first wiring.

4. The optical communication module according to claim 1, further comprising a first printed circuit board to which the first semiconductor chip and the second semiconductor chip are mounted, wherein
the first wiring is a wiring formed in the first printed circuit board.

5. The optical communication module according to claim 4, wherein
cooling means is provided to the second semiconductor chip.

6. The optical communication module according to claim 1, wherein
the first semiconductor chip is mounted on a first surface of the second semiconductor chip; and
the first wiring is a metal wiring formed in a wiring layer in the second semiconductor chip.

7. An optical communication device comprising:
a first wiring card mounting a first A optical communication connector and a first optical communication module;
a second wiring card mounting a second A optical communication connector and a second optical communication module; and
a first optical fiber cable connected between the first A optical communication connector and the second A optical communication connector and having a wiring length of several meters or less, wherein
the first optical communication module includes a first A semiconductor chip, a first laser diode transmitting a first optical signal to the first A optical communication connector formed on the first A semiconductor chip, a first wiring, and a first B semiconductor chip connected to the first A semiconductor chip via the first wiring;
the second optical communication module includes a second A semiconductor chip, first photodiode formed on the second A semiconductor chip, a second B semiconductor chip, and a first transimpedance amplifier circuit, the first photodiode converting the first optical signal received from the second A optical communication connector to an electric signal, and the first transimpedance amplifier circuit amplifying the current signal and converting the signal to a voltage signal; and
a first driver circuit driving the first laser diode by a first current, and a first driver control circuit detecting a temperature variation of the first A semiconductor chip transferred in heat via the first wiring and correcting magnitude of the first current based on a detection result are formed on the first B semiconductor chip.

8. The optical communication device according to claim 7, wherein
the optical communication device further includes a second optical fiber cable, wherein
the first wiring card further includes a first B optical communication connector connected to a first end of the second optical fiber cable;

the second wiring card further includes a second B optical communication connector connected to a second end of the second optical fiber cable;
the second optical communication module further includes a second laser diode formed to transmit a second optical signal to the second B optical communication connector and a second C semiconductor chip connected to the second B semiconductor chip via a second wiring;
the first optical communication module further includes a first C semiconductor chip, a second photodiode formed on the first C semiconductor chip and converting the second optical signal received from the first B optical communication connector to an electric signal;
the first B semiconductor chip further has a second transimpedance amplifier circuit formed to amplify the current signal from the second photodiode and convert the signal to a voltage signal; and
a second driver circuit driving the second laser diode by a second current, and a second driver control circuit detecting a temperature variation of the second C semiconductor chip transferred in heat via the second wiring and correcting magnitude of the second current based on a detection result are further formed on the second B semiconductor chip.

9. The optical communication device according to claim 7, wherein
the first driver control circuit includes a temperature detecting circuit generating a first voltage increased in proportion to temperature and generates a driver control voltage obtained by adding a predetermined offset voltage to the first voltage; and
the first driver control circuit includes a variable current source generating a current having magnitude corresponding to the driver control voltage and determining a reference value of the first current.

10. The optical communication device according to claim 9, wherein
the temperature detecting circuit includes:
first and second diodes having mutually different areas,
a constant current circuit causing an equal current to flow in the first diode and the second diode, and
a first amplifier circuit amplifying a voltage difference between a voltage generated at the first diode and a voltage generated at the second diode so as to output the first voltage.

11. The optical communication device according to claim 9, wherein
the first optical communication module further includes a first printed circuit board mounting the first A semiconductor chip and the first B semiconductor chip; and
the first wiring is a wiring formed in the first printed circuit board.

12. The optical communication device according to claim 11, wherein
cooling means is provided to the first B semiconductor chip.

13. The optical communication device according to claim 9, wherein
the first A semiconductor chip is mounted on a first surface of the first B semiconductor chip; and
the first wiring is a metal wiring formed in a wiring layer in the first B semiconductor chip.

* * * * *